(12) United States Patent  
Krieger et al.

(10) Patent No.: US 8,274,073 B2  
(45) Date of Patent: Sep. 25, 2012

(54) MEMORY DEVICE WITH IMPROVED SWITCHING SPEED AND DATA RETENTION

(75) Inventors: Juri Krieger, Brookline, MA (US); Stuart Spitzer, Lynnfield, MA (US)

(73) Assignee: Spansion LLC, Sunnyvale, CA (US)

(*) Notice: Subject to any disclaimer, the term of this patent is extended or adjusted under 35 U.S.C. 154(b) by 1315 days.

(21) Appl. No.: 11/078,873

(22) Filed: Mar. 11, 2005

(65) Prior Publication Data

US 2006/0202192 A1    Sep. 14, 2006

(51) Int. Cl.
*H01L 29/08* (2006.01)

(52) U.S. Cl. .................. 257/40; 257/319; 257/321

(58) Field of Classification Search .......... 257/40, 257/642, E51.023, E21.024, E51.03, E51.024, 257/319, 321

See application file for complete search history.

(56) References Cited

U.S. PATENT DOCUMENTS

| 6,324,091 | B1 | 11/2001 | Gryko et al. ............ 365/151 |
| 2002/0100909 | A1* | 8/2002 | Yamaguchi et al. ........ 257/59 |
| 2004/0026729 | A9* | 2/2004 | Krieger et al. ............ 257/306 |
| 2004/0245522 | A1 | 12/2004 | VanBuskirk et al. ......... 257/40 |

FOREIGN PATENT DOCUMENTS

| DE | 19959904 | 6/2001 |
| WO | WO 02/091385 | 11/2002 |

OTHER PUBLICATIONS

Juri Krieger, Stuart Spitzer, Non-Traditional,Non-Volatile Memory Based on Switching and Retention Phenomena in Polymeric Thin Films, 2004 IEEE, pp. 121-124.

* cited by examiner

*Primary Examiner* — Long Tran

(57) ABSTRACT

The present memory device includes first and second electrodes, a passive layer between the first and second electrodes, and an active layer between the passive layer and the second electrode. In undertaking an operation on the memory device, ions moves into within and from within the active layer, and the active layer is oriented so that the atoms of the active layer provide minimum obstruction to the movement of the ions into, within and from the active layer.

22 Claims, 5 Drawing Sheets

MEMORY DEVICE WITH IMPROVED SWITCHING SPEED AND DATA RETENTION

BACKGROUND OF THE INVENTION

1. Technical Field

This invention relates generally to memory devices, and more particularly, to a memory device with improved switching speed and data retention.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory devices. Each memory device can be accessed or "read", "written", and "erased" with information. The memory devices maintain information in an "off" or an "on" state, also referred to as "0" and "1". Typically, a memory device is addressed to retrieve a specified number of byte(s) (e.g., 8 memory devices per byte). For volatile memory devices, the memory devices must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30 which includes advantageous characteristics for meeting these needs. The memory device 30 includes a Cu electrode 32, a copper sulfide passive layer 34 on the electrode 32, an active layer 36 such as $Cu_2O$ or various polymers on the layer 34, and a Ti electrode 38 on the active layer 36. Initially, assuming that the memory device 30 is unprogrammed, in order to program the memory device 30, an increasingly negative voltage is applied to the electrode 38, while the electrode 32 is held at ground, so that an increasing electrical potential is applied across the memory device 30 from a higher to a lower potential in the direction from electrode 32 to electrode 38, until electrical potential $V_{pg}$ (the "programming" electrical potential) is reached (see FIG. 2, a plot of memory device current vs. electrical potential applied across the memory device 30). This potential $V_{pg}$ is sufficient to cause copper ions to be attracted from the superionic layer 34 toward the electrode 38 and into the active layer 36, causing the active layer 36 (and the overall memory device 30) to switch to a low-resistance or conductive state (A). Upon removal of such potential (B), the copper ions drawn into the active layer 36 during the programming step remain therein, so that the active layer 36 (and memory device 30) remain in a conductive or low-resistance state, as indicated by the resistance characteristic (B).

In order to erase the memory device (FIG. 2), an increasingly positive voltage is applied to the electrode 38, while the electrode 32 is held at ground, so that an increasing electrical potential is applied until electrical potential $V_{er}$ (the "erase" electrical potential) is applied across the memory device 30 from a higher to a lower electrical potential in the reverse direction. This potential $V_{er}$ is sufficient to cause copper ions to be repelled from the active layer 36 toward the electrode 32 and into the superionic layer 34 (C), in turn causing the active layer 36 (and the overall memory device 30) to be in a high-resistance or substantially non-conductive state. This state remains upon removal of such potential from the memory device 30.

FIG. 2 also illustrates the read step of the memory device 30 in its programmed (conductive) state and in its erased (nonconductive) state. An electrical potential $V_r$ (the "read" electrical potential) is applied across the memory device 30 from a higher to a lower electrical potential in the same direction as the electrical potential $V_{pg}$. This electrical potential is less than the electrical potential $V_{pg}$ applied across the memory device 30 for programming (see above). In this situation, if the memory device 30 is programmed, the memory device 30 will readily conduct current (level L1), indicating that the memory device 30 is in its programmed state. If the memory device 30 is erased, the memory device 30 will not conduct current (level L2), indicating that the memory device 30 is in its erased state.

It will readily be understood that a high switching speed, i.e., a rapid change from erased to programmed state and vice versa, are highly desirable characteristics. Reduction in this switching time provides increased overall operational speed of the memory. In addition, achieving such programming and erasing with low electrical potentials $V_{pg}$ and $V_{er}$ is also highly desirable, reducing power requirements of the memory. In order to achieve rapid switching speed, the ions in the passive layer, in the programming operation, must be rapidly transported from the passive layer into and within the active layer, and in the erasing operation, the ions must be rapidly transported within and from the active layer into the passive layer. As pointed out above, this transport of ions should be achievable using low electrical potentials $V_{pg}$ and $V_{er}$ respectively.

With the material of the active layer provided in a conventional manner, the atoms of the active layer may be positioned so to hinder this desired rapid movement of ions. For example, if a crystal polymer is selected for the active layer, with the active layer placed on the passive layer in the conventional manner, the atoms of the crystal lattice of the polymer layer are oriented so as to provide significant obstruction to such movement of the ions during programming and erasing of the memory device, i.e., the atoms are not oriented so as to provide relatively open paths or channels therewithin for movement of the ions into, within and from the active layer. Clearly, this causes the switching speed of the memory device to be slower than optimum, and causes the electrical potentials $V_{pg}$ and $V_{er}$ used in programming and erasing the device to be greater than is desirable.

Therefore, what is needed is an approach wherein rapid switching of the memory devices is achieved while using low programming and erasing electrical potentials. Furthermore, the features should be accompanied by high data retention characteristics of the memory device.

DISCLOSURE OF THE INVENTION

Broadly stated, the present invention is a memory device comprising first and second electrodes, a passive layer between the first and second electrodes, and an active layer between the passive layer and the second electrode, and having a plurality of associated elements. In undertaking an operation on the memory device, a charged species moves within the active layer in a general direction away from the first electrode and toward the second electrode, the active layer being oriented so that the elements of the active layer provide minimum obstruction to the movement of the charged species within the active layer in the general direction toward the second electrode.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
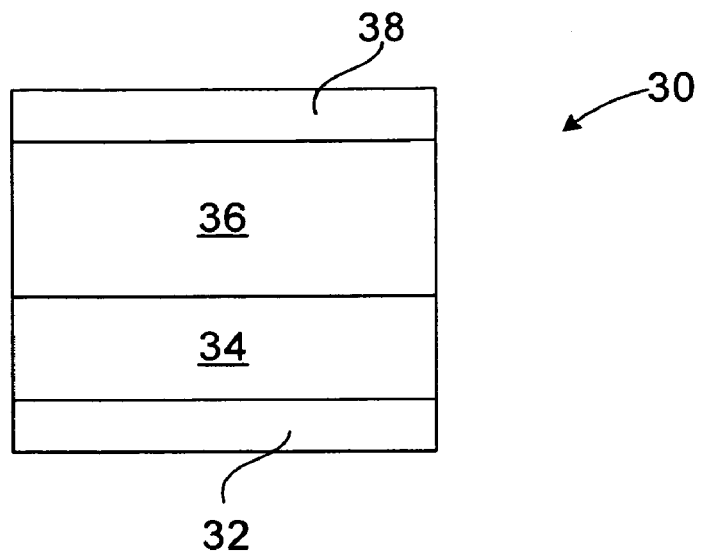
FIG. 1 is a cross-sectional view of a typical memory device.
Figure 2:
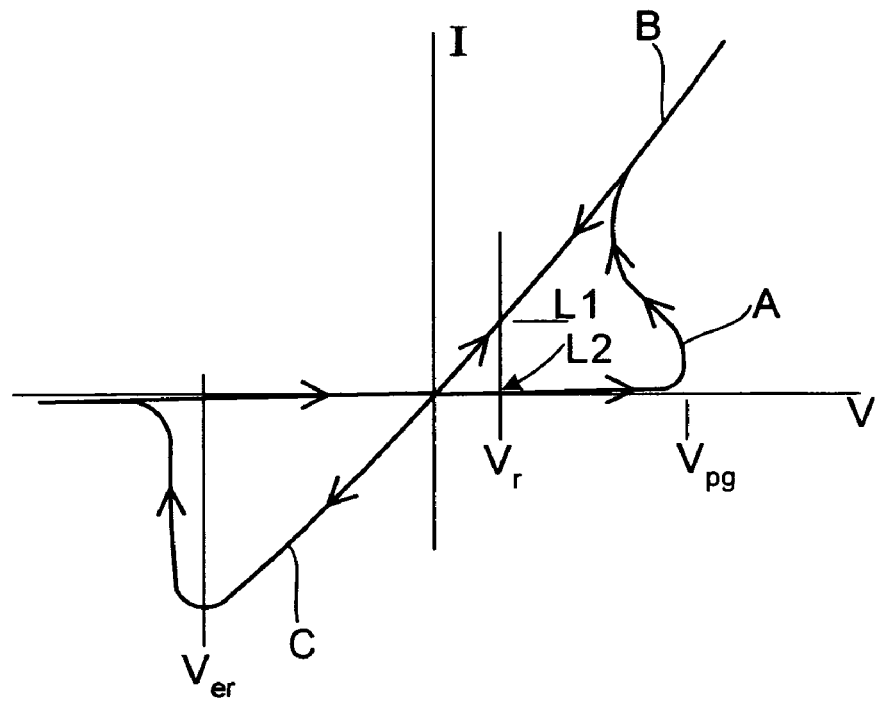
FIG. 2 is a plot of current vs. voltage in the programming, reading and erasing of the memory device of FIG. 1.
Figure 3:
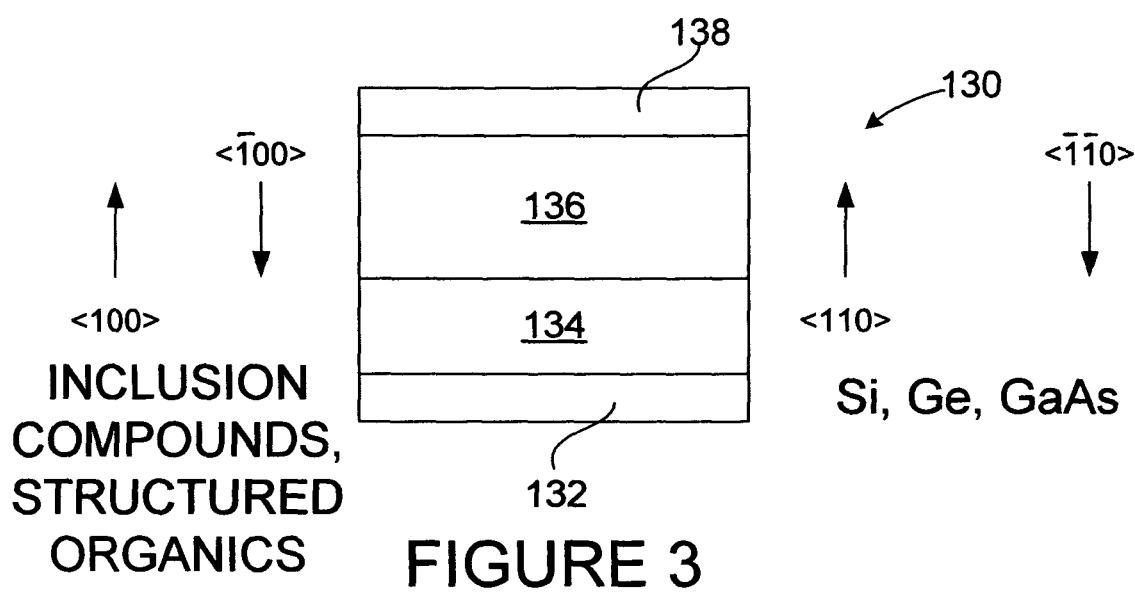
FIG. 3 is a cross-sectional view of the present memory device.

FIG. 3 illustrates an embodiment of memory device 130 of the present invention. The memory device 130 includes a Cu electrode 132, a copper sulfide passive layer 134 on, over and in contact with the electrode 132, an active layer 136 on, over and in contact with the passive layer 134, and a Ti electrode 138 on, over and in contact with the active layer 136.

Figure 4:
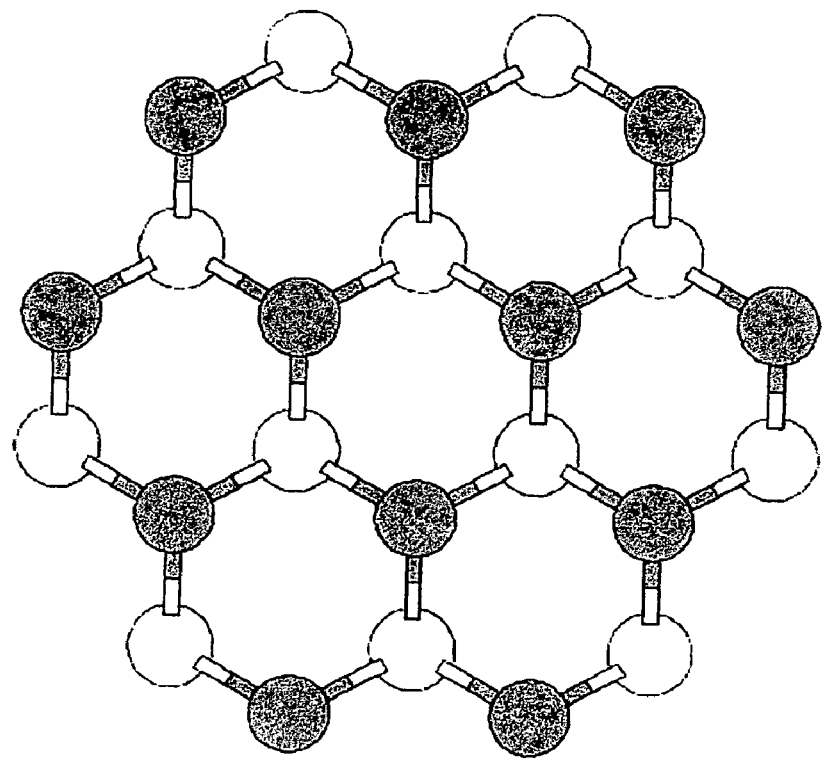
FIG. 4 is a perspective view of a first type of material making up the active layer of the memory device, in a first orientation.
Figure 5:
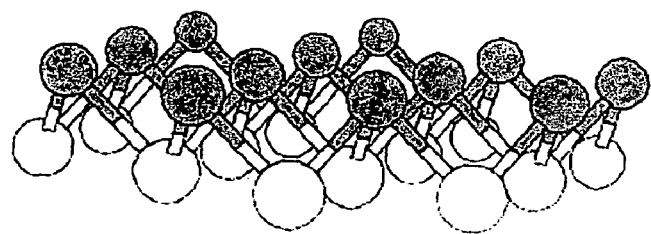
FIG. 5 is a perspective view of the first type of material making up the active layer of the memory device, in a second orientation.

In a first embodiment of memory device 130, the material for the active layer 136 is an inclusion compound, i.e., a complex in which the material (the "host") forms a cavity or, in the case of a crystal, a crystal lattice containing spaces in the shape of long tunnels or channels in which molecular entities of a second material (the "guest") are located. In such a situation, there is no covalent bonding between guest and host, the attraction being generally due to van der Waals forces. In one embodiment, the active layer 136 layer is $Nb_3Se_4$, the crystal lattice structure of which is illustrated in FIGS. 4 and 5. FIG. 4 illustrates the crystal lattice configuration of the Nb3Se4 as viewed in the <100> direction. The $Nb_3Se_4$ active layer 136 is oriented so that this <100> direction is as shown in FIG. 3, running in the direction between the electrode 132 and the electrode 138. As so oriented, the crystal lattice of the $Nb_3Se_4$ presents large channels for ion travel. That is, for example, as set forth above, in programming the memory device 130, an increasingly negative voltage is applied to the electrode 138, while the electrode 132 is held at ground, so that an increasing electrical potential is applied across the memory device 130 from a higher to a lower potential in the direction from electrode 132 to electrode 138, until electrical potential $V_{pg1}$ is reached. This potential $V_{pg1}$ is sufficient to cause charged copper ions to be attracted from the superionic layer 134 into and within the active layer 136 in a general direction (the <100> direction) toward the electrode 138, causing the active layer 136 (and the overall memory device 130) to switch to a low-resistance or conductive state. With the active layer 136 so oriented, the elements of the active layer 136, i.e., the Nb and Se atoms thereof, provide minimum obstruction to the movement of the ions from the passive layer 134 into and within the active layer 136 and toward the electrode 138. As a comparison, FIG. 5 illustrates the crystal lattice configuration of FIG. 4 rotated to a different orientation. This crystal lattice orientation as illustrated in FIG. 5, if presented to ions traveling from the passive layer 134 into and within the active layer 136 and toward the electrode 138, would in turn present greatly increased obstruction to such ion travel, thereby substantially impeding this ion travel. By providing a minimum of obstruction to such ion movement, it will be seen that in programming the memory device 130, ions travel into and within the active layer 136 more easily and readily and with less resistance, resulting in improved programming speed and a lower programming voltage requirement.

This improvement applies also to erasing of the memory device 130. In erasing the memory device 130, an increasingly positive voltage is applied to the electrode 138, while the electrode 132 is held at ground, so that an increasing electrical potential is applied until electrical potential $V_{er1}$ is applied across the memory device 130 from a higher to a lower electrical potential in the reverse direction. This potential $V_{er1}$ is sufficient to cause copper ions to be repelled from the active layer 136, moving within the active layer 136 in a general direction (the <100> direction) toward the electrode 132 and into the superionic layer 134, in turn causing the active layer 136 (and the overall memory device 130) to be in a high-resistance or substantially non-conductive state. Again, with the active layer 136 so oriented, the elements of the active layer, i.e., the Nb and Se atoms thereof, provided minimum obstruction to the movement of the ions within and from the active layer 136 into the passive layer 134 and toward the electrode 132. By providing a minimum of obstruction to such ion movement, it will be seen that in erasing the memory device 130, ions travel within and from the layer active layer 136 more easily and readily and with less resistance, resulting in improved erasing speed and a lower erase voltage requirement.

Other examples of inclusion compounds which can readily be used to make up the active layer 136 are $TiSe_2$, $ZrTe_2$ and $HfS_2$.

Figure 6:
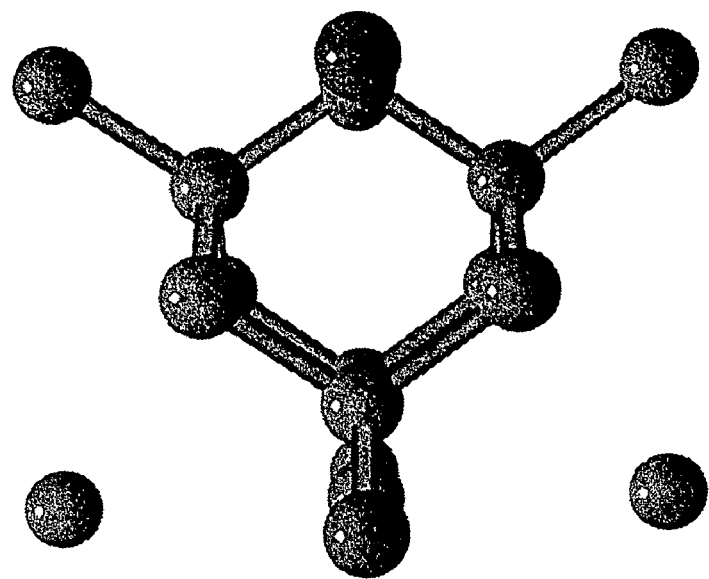
FIG. 6 is a perspective view of a second type of material making up the active layer of the memory device, in a first orientation.
Figure 7:
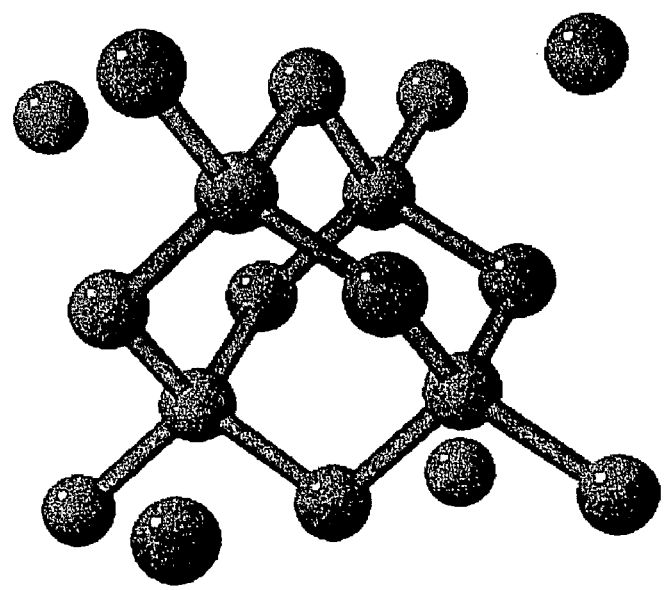
FIG. 7 is a perspective view of the second type of material making up the active layer of the memory device, in a second orientation.

In a second embodiment of memory device 130, the material for the active layer 136 is semiconductor material, in this embodiment Si, the crystal lattice structure of which is illustrated in FIGS. 6 and 7. FIG. 6 illustrates the crystal lattice configuration of the Si as viewed in the <110> direction. The Si active layer 136 is oriented so that this <110> direction is as shown in FIG. 3, running in the direction between the electrode 132 and the electrode 138. As so oriented, the crystal lattice of the Si presents large channels for ion travel. That is, for example, as set forth above, in programming the memory device 130, an increasingly negative voltage is applied to the electrode 138, while the electrode 132 is held at ground, so that an increasing electrical potential is applied across the memory device 130 from a higher to a lower potential in the direction from electrode 132 to electrode 138, until electrical potential $V_{pg2}$ is reached. This potential $V_{pg2}$ is sufficient to cause charged copper ions to be attracted from the superionic layer 134 into and within the active layer 136 in a general direction (the <110> direction) toward the electrode 138, causing the active layer 136 (and the overall memory device 130) to switch to a low-resistance or conductive state. With the active layer 136 so oriented, the elements of the active layer 136, i.e., the Si atoms thereof, provide minimum obstruction to the movement of the ions from the passive layer 134 into and within the active layer 136 and toward the electrode 138. As a comparison, FIG. 7 illustrates the crystal lattice configuration of FIG. 6 rotated to a different orientation. This crystal lattice orientation as illustrated in FIG. 7, if presented to ions traveling from the passive layer 134 into and within the active layer 136 and toward the electrode 138, would in turn present greatly increased obstruction to such ion travel, thereby substantially impeding this ion travel. By providing a minimum of obstruction to such ion movement, it will be seen that in programming the memory device 130, ions travel into and within the active layer 136 more easily and readily and with less resistance, resulting in improved programming speed and a lower programming voltage requirement.

This improvement applies also to erasing of the memory device 130. In erasing the memory device 130, an increasingly positive voltage is applied to the electrode 138, while the electrode 132 is held at ground, so that an increasing electrical potential is applied until electrical potential $V_{er2}$ is applied across the memory device 130 from a higher to a lower electrical potential in the reverse direction. This potential $V_{er2}$ is sufficient to cause copper ions to be repelled from the active layer 136, moving within the active layer 136 in a general direction (the <110> direction) toward the electrode 132 and into the superionic layer 134, in turn causing the active layer 136 (and the overall memory device 130) to be in a high-resistance or substantially non-conductive state. Again, with the active layer 136 so oriented, the elements of the active layer, i.e., the Si atoms thereof, provided minimum obstruction to the movement of the ions within and from the active layer 136 into the passive layer 134 and toward the electrode 132. By providing a minimum of obstruction to such ion movement, it will be seen that in erasing the memory device 130, ions travel within and from the layer active layer 136 more easily and readily and with less resistance, resulting in improved erasing speed and a lower erase voltage requirement.

Other examples of crystalline semiconductor materials which can readily be used to make up the active layer 136 are Ge and GaAs, each of which has the same atom placement as illustrated in FIGS. 6 and 7.

Figure 8:
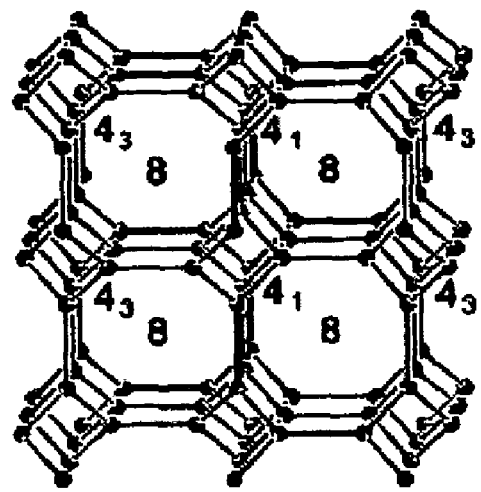
FIG. 8 is a perspective view of a third type of material making up the active layer of the memory device, in a first orientation.
Figure 9:
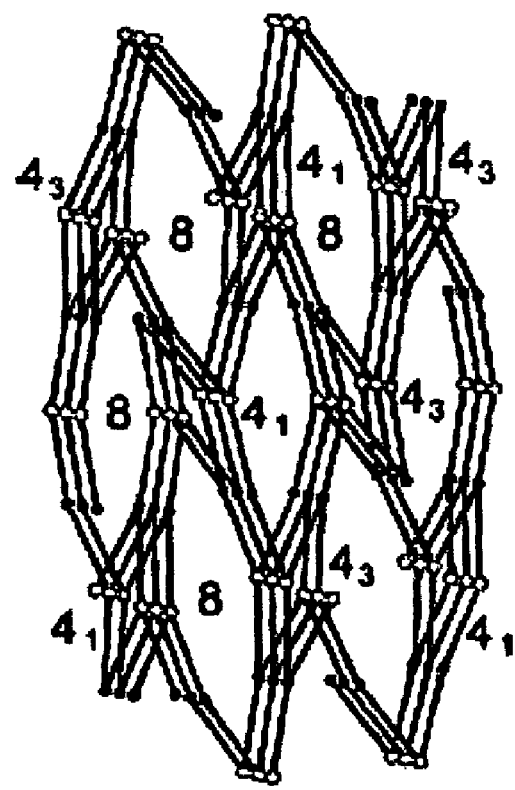
FIG. 9 is a perspective view of the third type of material making up the active layer of the memory device, in a second orientation.

In a third embodiment of memory device 130, the material for the active layer 136 is structured organic material, in this embodiment a phthalocyanine (polyphthalocyanine structure formed from tetracyanobenzene), the crystal lattice structure of which is illustrated in FIGS. 8 and 9. FIG. 8 illustrates the crystal lattice configuration of the phthalocyanine as viewed in the <100> direction. The phthalocyanine active layer 136 is oriented so that this <100> direction is as shown in FIG. 3, running in the direction between the electrode 132 and the electrode 138. As so oriented, the crystal lattice of the phthalocyanine presents large channels for ion travel. That is, for example, as set forth above, in programming the memory device 130, an increasingly negative voltage is applied to the electrode 138, while the electrode 132 is held at ground, so that an increasing electrical potential is applied across the memory device 130 from a higher to a lower potential in the direction from electrode 132 to electrode 138, until electrical potential $V_{pg3}$ is reached. This potential $V_{pg3}$ is sufficient to cause charged copper ions to be attracted from the superionic layer 134 into and within the active layer 136 in a general direction (the <100> direction) toward the electrode 138, causing the active layer 136 (and the overall memory device 130) to switch to a low-resistance or conductive state. With the active layer 136 so oriented, the elements of the active layer 136, i.e., the atoms thereof, provide minimum obstruction to the movement of the ions from the passive layer 134 into and within the active layer 136 and toward the electrode 138. As a comparison, FIG. 9 illustrates the crystal lattice configuration of FIG. 8 rotated to a different orientation. This crystal lattice orientation as illustrated in FIG. 9, if presented to ions traveling from the passive layer 134 into and within the active layer 136 and toward the electrode 138, would in turn present greatly increased obstruction to such ion travel, thereby substantially impeding this ion travel. By providing a minimum of obstruction to such ion movement, it will be seen that in programming the memory device 130, ions travel into and within the active layer 136 more easily and readily and with less resistance, resulting in improved programming speed and a lower programming voltage requirement.

This improvement applies also to erasing of the memory device 130. In erasing the memory device 130, an increasingly positive voltage is applied to the electrode 138, while the electrode 132 is held at ground, so that an increasing electrical potential is applied until electrical potential $V_{er3}$ is applied across the memory device 130 from a higher to a lower electrical potential in the reverse direction. This potential $V_{er3}$ is sufficient to cause copper ions to be repelled from the active layer 136, moving within the active layer 136 in a general direction (the <100> direction) toward the electrode 132 and into the superionic layer 134, in turn causing the active layer 136 (and the overall memory device 130) to be in a high-resistance or substantially non-conductive state. Again, with the active layer 136 so oriented, the elements of the active layer, i.e., the atoms thereof, provided minimum obstruction to the movement of the ions within and from the active layer 136 into the passive layer 134 and toward the electrode 132. By providing a minimum of obstruction to such ion movement, it will be seen that in erasing the memory device 130, ions travel within and from the layer active layer 136 more easily and readily and with less resistance, resulting in improved erasing speed and a lower erase voltage requirement.

It will be seen that with in the present embodiments, the overall switching speed of the memory device is greatly improved. In addition, the present embodiments provide improved data retention. The channels of the respective active layers described and illustrated provide a more stable platform for the ions therewithin, improving stability of the programmed memory device.

The foregoing description of the embodiments of the invention has been presented for purposes of illustration and description. It is not intended to be exhaustive or to limit the invention to the precise form disclosed. Other modifications or variations are possible in light of the above teachings.

The embodiment were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic device comprising:
   first and second electrodes;
   a layer between the first and second electrodes, and having a plurality of associated elements;
   wherein in undertaking an operation on the electronic device, a charged species moves within the layer in a general direction oriented from the first electrode to the second electrode;
   the layer being oriented so that the elements of the layer provide minimum obstruction to the movement of the charged species within the layer wherein the layer includes channels in a lattice structure that are oriented to run in the <100> direction from the first electrode to the second electrode.

2. The electronic device of claim 1 wherein the layer comprises inclusion compound material.

3. The electronic device of claim 1 wherein the layer comprises crystalline semiconductor material.

4. The electronic device of claim 1 wherein the layer comprises structured organic material.

5. The electronic device of claim 1 wherein the layer is of a crystal lattice configuration.

6. A memory device comprising:
   first and second electrodes;
   a passive layer between the first and second electrodes;
   an active layer between the passive layer and the second electrode, and having a plurality of associated elements;
   wherein in undertaking an operation on the memory device, a charged species moves within the active layer in a general direction away from one electrode and toward the other electrode;
   the active layer being oriented so that the elements of the active layer provide minimum obstruction to the movement of the charged species within the active layer wherein the active layer includes channels in a lattice structure that are oriented to run in the <100> direction from the first electrode to the second electrode.

7. The electronic device of claim 6 wherein the active layer comprises inclusion compound material.

8. The electronic device of claim 6 wherein the active layer comprises crystal line semiconductor material.

9. The electronic device of claim 6 wherein the active layer comprises structured organic material.

10. The memory device of claim 6 wherein the active layer is of a crystal lattice configuration.

11. A memory device comprising:
    first and second electrodes;
    a passive layer between the first and second electrodes;
    an active layer between the passive layer and the second electrode, and having a plurality of associated elements;
    wherein in programming the memory device, a charged species moves from the passive layer into and within the active layer in a general direction toward the second electrode;
    the active layer being oriented so that the elements of the active layer provide minimum obstruction to the movement of the charged species wherein the active layer includes channels in a lattice structure that are oriented to run in the <100> direction from the first electrode to the second electrode.

12. The electronic device of claim 11 wherein the active layer comprises inclusion compound material.

13. The electronic device of claim 11 wherein the active layer comprises crystalline semiconductor material.

14. The electronic device of claim 11 wherein the active layer comprises structured organic material.

15. The memory device of claim 11 wherein the active layer is of a crystal lattice configuration.

16. The memory device of claim 11 wherein the charged species comprises ions.

17. A memory device comprising:
first and second electrodes;
a passive layer between the first and second electrodes;
an active layer between the passive layer and the second electrode, and having a plurality of associated elements;
wherein in erasing the memory device, a charged species moves within and from the active layer into the passive layer in a general direction toward the first electrode;
the active layer being oriented so that the elements of the active layer provide minimum obstruction to the movement of the charged species within and from the active layer and into the passive layer wherein the active layer includes channels in a lattice structure that are oriented to run in the <100> direction from the first electrode to the second electrode.

18. The electronic device of claim 17 wherein the active layer comprises inclusion compound material.

19. The electronic device of claim 17 wherein the active layer comprises crystalline semiconductor material.

20. The electronic device of claim 17 wherein the active layer comprises structured organic material.

21. The memory device of claim 17 wherein the active layer is of a crystal lattice configuration.

22. The memory device of claim 17 wherein the charged species comprises ions.

* * * * *